United States Patent
Hwang (10) Patent No.: US 7,382,299 B2
(45) Date of Patent: Jun. 3, 2008

(54) METHOD OF CALIBRATING DIGITAL-TO-ANALOG CONVERTER INPUT BASED ON ANALOG-TO-DIGITAL CONVERTER OUTPUT AND ANALOG ENCODING APPARATUS EMPLOYING THE METHOD

(75) Inventor: Ho-bin Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/594,730

(22) Filed: Nov. 9, 2006

(65) Prior Publication Data
US 2007/0109162 A1    May 17, 2007

(30) Foreign Application Priority Data
Nov. 11, 2005    (KR) ................ 10-2005-0108118

(51) Int. Cl.
*H03M 1/10* (2006.01)

(52) U.S. Cl. .............. 341/120; 341/144; 341/145; 341/156

(58) Field of Classification Search ........... 341/120, 341/144, 155, 156
See application file for complete search history.

(56) References Cited

U.S. PATENT DOCUMENTS

| | | | | |
|---|---|---|---|---|
| 3,976,869 A | * | 8/1976 | Stella et al. ............... | 708/4 |
| 4,222,107 A | * | 9/1980 | Mrozowski et al. ........ | 702/107 |
| 4,612,533 A | * | 9/1986 | Evans ....................... | 341/120 |
| 5,248,970 A | | 9/1993 | Sooch et al. | |
| 5,287,108 A | * | 2/1994 | Mayes et al. ............... | 341/156 |
| 5,500,644 A | * | 3/1996 | Denjean et al. ............ | 341/120 |
| 6,226,466 B1 | * | 5/2001 | Ojima et al. ................ | 399/49 |
| 6,646,581 B1 | * | 11/2003 | Huang ....................... | 341/143 |
| 2005/0156553 A1 | | 7/2005 | Chun | |

FOREIGN PATENT DOCUMENTS

| | | |
|---|---|---|
| JP | 2002-217730 | 8/2002 |
| JP | 2002-314417 | 10/2002 |
| JP | 2002-368614 | 12/2002 |

OTHER PUBLICATIONS

Office Action issued on Apr. 26, 2007 by the Korean Intellectual Property Office for Korean Patent Application No. 2005-108118.

* cited by examiner

*Primary Examiner*—Jean B Jeanglaude
(74) *Attorney, Agent, or Firm*—Stein, McEwen & Bui, LLP (57) ABSTRACT

A method of calibrating an input of a digital-to-analog (D/A) converter based on an output of an analog-to-digital (A/D) converter in an analog encoding apparatus including the D/A converter and the A/D converter, the method including inputting a certain range of input values to the D/A converter while the output of the D/A converter is connected to the input of the A/D converter, thereby producing corresponding output values from the A/D converter; generating a calibration table representing a relationship between input values of the D/A converter and output values of the A/D converter based on the input values in the certain range of input values inputted to the D/A converter and the corresponding output values produced from the A/D converter; and adjusting an input value of the D/A converter based on the calibration table while the output of the D/A converter is disconnected from the input of the A/D converter.

17 Claims, 5 Drawing Sheets

METHOD OF CALIBRATING DIGITAL-TO-ANALOG CONVERTER INPUT BASED ON ANALOG-TO-DIGITAL CONVERTER OUTPUT AND ANALOG ENCODING APPARATUS EMPLOYING THE METHOD

CROSS-REFERENCE TO RELATED APPLICATION

This application claims the benefit of Korean Patent Application No. 2005-108118 filed on Nov. 11, 2005, in the Korean Intellectual Property Office, the disclosure of which is incorporated herein by reference in its entirety.

BACKGROUND OF THE INVENTION

1. Field of the Invention

An aspect of the invention relates to a method of calibrating an input of a digital-to-analog (D/A) converter based on an output of an analog-to-digital (A/D) converter, and an apparatus employing the method. More particularly, an aspect of the invention relates to a method of calibrating an input of a D/A converter based on an output of an A/D converter to compensate for a functional difference between the A/D converter and the D/A converter in an analog encoding apparatus generating digital encoding signals using the D/A converter, and to the analog encoding apparatus employing the method.

2. Description of the Related Art

Due to rapid growth in automatic control systems, processing of signals output from various sensors to enable accurate control of an object has become important. In general, an analog encoding apparatus is used in image forming apparatuses such as a printer and a copier to generate a digital encoding signal for controlling a motor.

Figure 1:
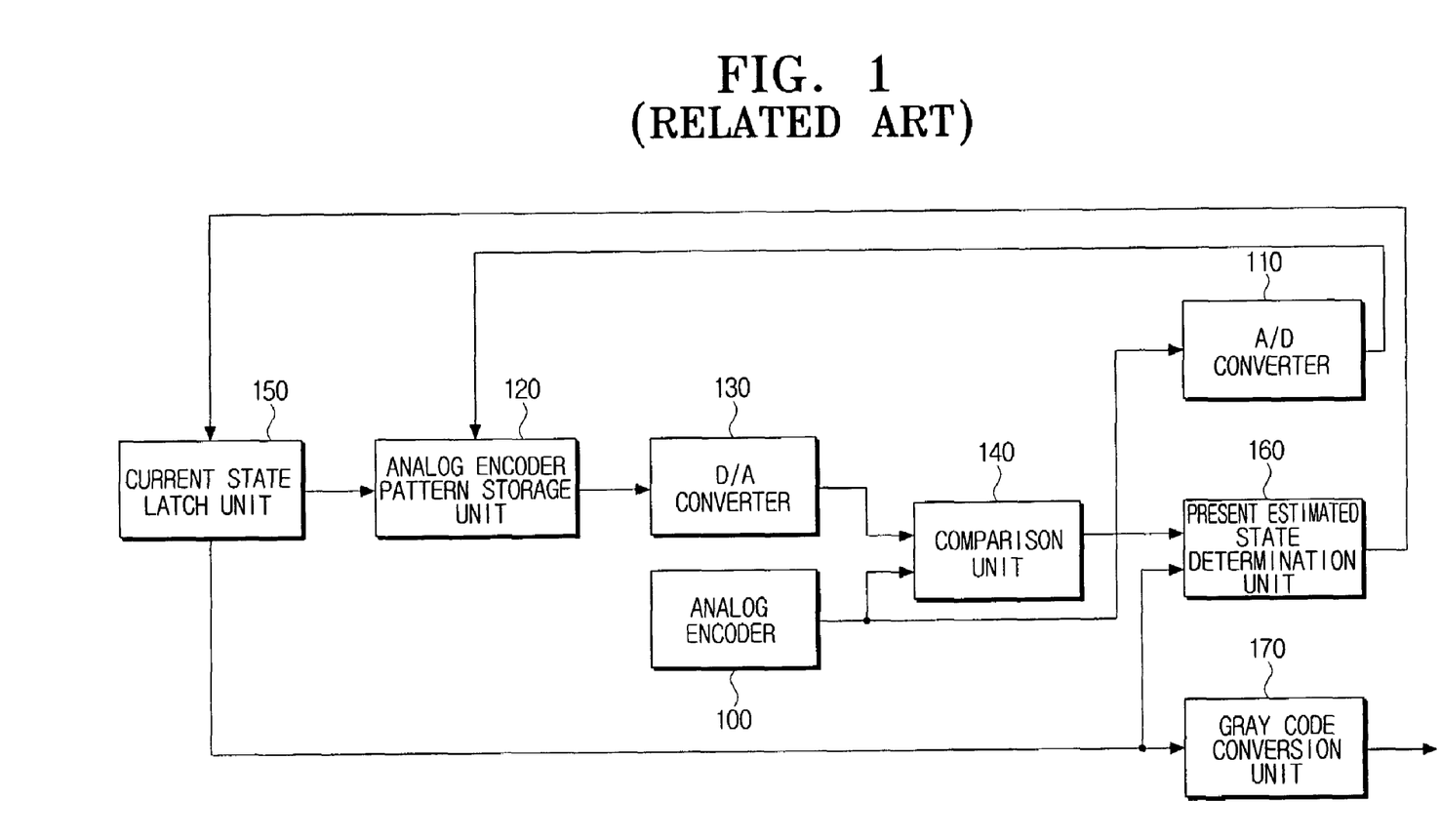
FIG. 1 is a block diagram of an analog encoding apparatus of the related art.

FIG. 1 is a block diagram an analog encoding apparatus of the related art that includes an analog encoder 100, an analog-to-digital (A/D) converter 110, an analog encoder pattern storage unit 120, a digital-to-analog (D/A) converter 130, a comparison unit 140, a current state latch unit 150, a present estimated state determination unit 160, and a Gray code conversion unit 170.

The analog encoder 100 is connected to a shaft of a motor and outputs two quasi-sinusoidal signals having a same period but differing in phase by 90° that go through a predetermined number of complete periods during one rotation of the motor shaft. The A/D converter 110 digitizes the two output signals of the analog encoder 100 at a plurality of sampling points in one complete period of the two output signals to obtain an analog encoder pattern that is stored in the analog encoder pattern storage unit 120. The sampling points correspond to states of the two output signals of the analog encoder 100, and the analog encoder pattern storage unit 120 stores the analog encoder pattern indexed by these states. For example, if there are 8 sampling points, these 8 sampling points respectively correspond to 8 states numbered 0 to 7, or 000 to 111 in binary notation, and the analog encoder pattern storage unit 120 stores the digitized values of the two output signals of the analog encoder 100 as analog encoder pattern values indexed by state values of 000 to 111. Thus, for example, the digitized values of the two output signals sampled at the first sampling point corresponding to the state 0 are stored as two analog encoder pattern values indexed by a state value of 000. The analog encoder pattern storage unit 120 outputs two analog encoder pattern values corresponding to a current state in response to a current state input to the analog encoder pattern storage unit 120 from the current state latch unit 150. Thus, for example, if the current state input from the current state latch unit 150 is the state 0, the analog encoder pattern storage unit 120 outputs the two analog encoder pattern values that are indexed by the state value of 000. The D/A converter 130 converts the two analog encoder pattern values output from the analog encoder pattern storage unit 120 to two analog values. The comparison unit 140 compares the two analog values from the D/A converter 130 with corresponding ones of the two output signals of the analog encoder 100, thereby generating state change information. The present estimated state determination unit 160 determines a present estimated state based on the state change information from the comparison unit 140 and the current state from the current state latch unit 150, and outputs the present estimated state to the current state latch unit 150. The current state latch unit 150 latches the present estimated state from the present estimated state determination unit 160 in synchronism with a reference clock to produce a current state, and outputs the current state to the analog encoder pattern storage unit 120, the present estimated state determination unit 160, and the Gray code conversion unit 170. The Gray code conversion unit 170 converts the current state input from the current state latch unit 150 into Gray-coded digital encoding signals.

In other words, in the analog encoding apparatus of the related art, a relationship between the analog encoder pattern values obtained from the output signals of the analog encoder 100 by the A/D converter 110 and states of the output signals of the analog encoder 100 is stored in a tabular form. Furthermore, the analog encoder pattern values corresponding to a current state are output in digital form to the D/A converter 130 which converts them to analog signals which are compared to the output signals of the analog encoder 100 by the comparison unit 140.

Therefore, when an analog encoder pattern value obtained in digital form by the A/D converter 110 from an output signal of the analog encoder 100 is converted to an analog signal by the D/A converter 130, a value of the analog signal converted by the D/A converter 130 should equal a value of the output signal of the analog encoder 100 at the time the analog encoder pattern value was obtained. However, when there is a functional difference between the A/D converter 110 and the D/A converter 130, the value of the analog signal converted by the D/A converter 100 is not equal to the value of the output signal of the analog encoder 100, and therefore the comparison unit 140 will produce an incorrect result when it compares the analog signal converted by the D/A converter 130 with the output signal of the analog encoder 100. Accordingly, the accuracy of the digital encoding signals generated by the Gray code conversion unit 170 is decreased.

SUMMARY OF THE INVENTION

An aspect of the invention is to provide a method of calibrating an input of a digital-to-analog (D/A) converter based on an output of an analog-to-digital (A/D) converter in an analog encoding apparatus that generates high-accuracy digital encoding signals to compensate for a functional difference between the A/D converter and the D/A converter, and an analog encoding apparatus employing the method.

In accordance with an aspect of the invention, there is provided a method of calibrating an input of a digital-to-analog (D/A) converter based on an output of an analog-to-digital (A/D) converter in an analog encoding apparatus including the D/A converter and the A/D converter, the method including connecting an output of the D/A converter to an input of the A/D converter; inputting a certain range of sequentially increasing input values to the D/A converter while the output of the D/A converter is connected to the input of the A/D converter, thereby producing corresponding output from the A/D converter; generating a calibration table representing a relationship between input values of the D/A converter and output values of the A/D converter based on the input values in the certain range of sequentially increasing input values inputted to the D/A converter and the corresponding output values produced from the A/D converter; disconnecting the output of the D/A converter from the input of the A/D converter; and adjusting an input value of the D/A converter based on the calibration table while the output of the D/A converter is disconnected from the input of the A/D converter.

The input value of the D/A converter to be adjusted may be an output value of the A/D converter corresponding to a present state, and the adjusting may include obtaining from the calibration table an input value corresponding to the output value of the A/D converter corresponding to the present state and inputting the obtained input value to the D/A converter in place of the input value of the D/A converter to be adjusted.

The method may further include generating a matching table that matches the input values in the certain range of sequentially increasing input values inputted to the D/A converter to the corresponding output values produced from the A/D converter.

The generating of the calibration table may include generating the calibration table based on the matching table.

In accordance with an aspect of the invention, an analog encoding apparatus includes a digital-to-analog (D/A) converter; an analog-to-digital (A/D) converter; a multiplexer (MUX) that selectively connects and disconnects an output of the D/A converter to an input of the A/D converter; and a calibration unit that inputs a certain range of sequentially increasing input values to the D/A converter while the output of the D/A converter is connected to the input of the A/D converter by the MUX, thereby producing corresponding output values from the A/D converter, generates a calibration table representing a relationship between input values of the D/A converter and output values of the A/D converter based on the input values in the certain range of sequentially increasing input values inputted to the D/A converter and the corresponding output values produced from the A/D converter, and adjusts an input value of the D/A converter based on the calibration table while the output of the D/A converter is disconnected from the input of the A/D converter by the MUX.

The input value of the D/A converter to be adjusted may be an output value of the A/D converter corresponding to a present state; and the calibration unit may obtain from the calibration table an input value corresponding to the output value of the A/D converter corresponding to the present state and inputs the obtained input value to the D/A converter in place of the input value of the D/A converter to be adjusted.

The apparatus may further include a control unit that generates a matching table that matches the input values in the certain range of sequentially increasing input values inputted to the D/A converter to the corresponding output values of the A/D converter produced from the A/D converter.

The calibration unit may generate the calibration table based on the matching table.

In accordance with an aspect of the invention, there is provided a method of compensating for a functional difference between a digital-to-analog (D/A) converter and an analog-to-digital (A/D) converter in an analog encoding apparatus that generates a digital encoding signal based on a comparison between a current value of an output signal of an analog encoder and an analog value generated by the D/A converter based on a selected one of a plurality of digital values previously generated by the A/D converter by sampling a value of the output signal of the analog encoder at a plurality of sampling points, the functional difference between the D/A converter and the A/D converter causing analog values generated by the D/A converter based on at least some of the plurality of digital values to be not equal to respective values of the analog encoder signal as sampled by the A/D converter in generating the at least some of the plurality of digital values, the method including detecting the functional difference between the D/A converter and the A/D converter; and adjusting an input value to be inputted to the D/A converter to compensate for the detected functional difference.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent from the following description of embodiments of the invention, taken in conjunction with the accompanying drawings of which.

DETAILED DESCRIPTION OF THE EMBODIMENTS

Reference will now be made in detail to embodiments of the invention, examples of which are illustrated in the accompanying drawings, wherein like reference numerals refer to like elements throughout. The embodiments are described below in order to explain the invention by referring to the figures.

Specific examples in the description of a detailed construction and specific elements are merely provided to assist in a comprehensive understanding of the invention. Thus, it is apparent that the invention can be carried out without these specific examples. Also, well-known functions or constructions are not described in detail to avoid obscuring the invention with unnecessary detail.

Figure 2:
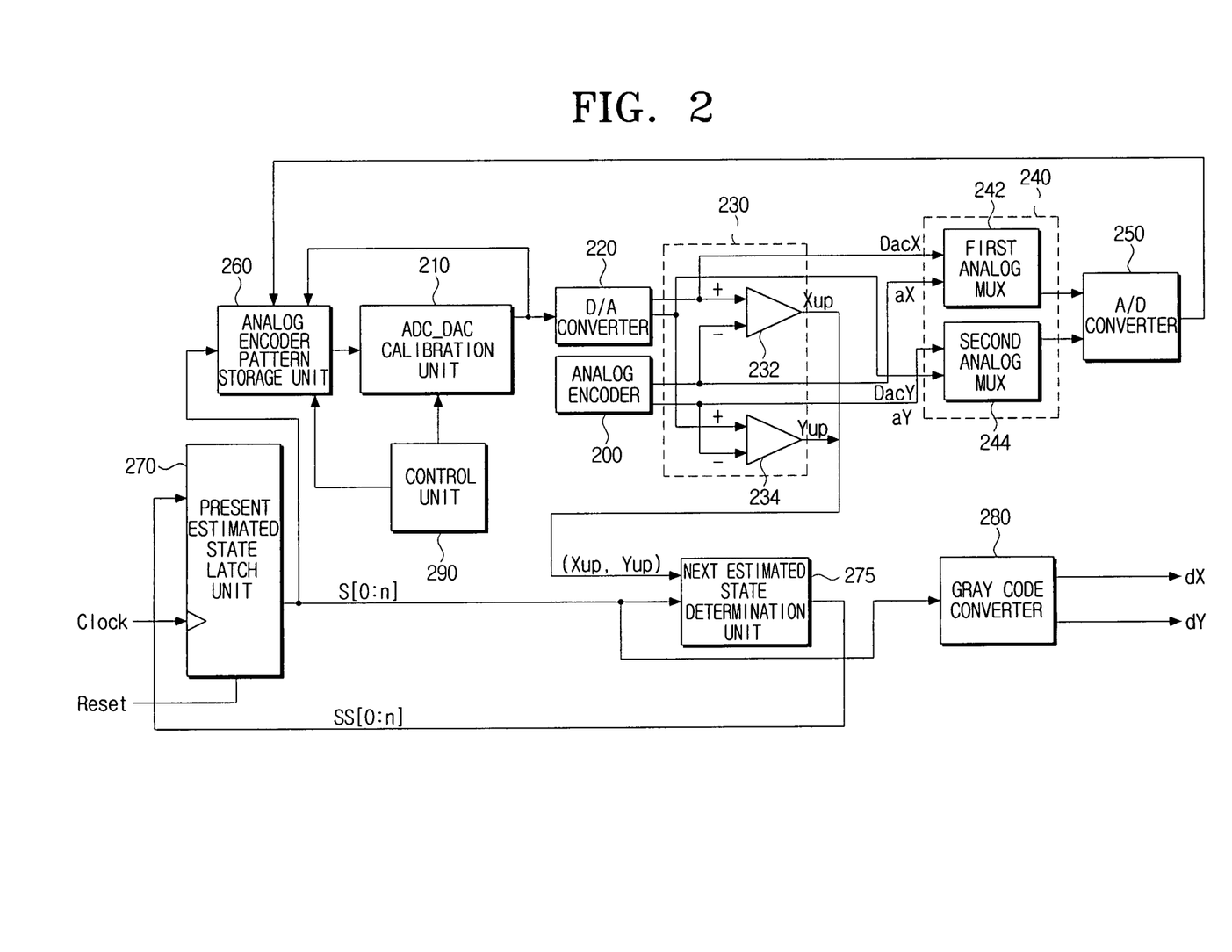
FIG. 2 is a block diagram of an analog encoding apparatus according to an embodiment of the invention.

FIG. 2 is a block diagram of an analog encoding apparatus according to an embodiment of the invention.

In a calibration operation of the analog encoding apparatus, the analog encoding apparatus connects outputs of a digital/analog (D/A) converter 220 to inputs of an analog/digital (A/D) converter 250 via a multiplexer 240 and generates a calibration table based on input values input to the D/A converter 220 and output values output from the A/D converter 250. The analog encoding apparatus then calibrates an input of the D/A converter 220 based on the calibration table.

The analog encoding apparatus includes an analog encoder 200, an analog-to-digital converter_digital-to-analog converter (ADC_DAC) calibration unit 210, the D/A converter 220, a comparison unit 230, a multiplexer (MUX) 240, the A/D converter 250, an analog encoder pattern storage unit 260, a present estimated state latch unit 270, a next estimated state determination unit 275, a Gray code converter 280, and a control unit 290.

The analog encoder 200 is being connected to a shaft of a motor and outputs two quasi-sinusoidal signals having a same period but differing in phase by 90° that each go through a predetermined number of complete periods during one rotation of the motor shaft. The predetermined number of complete revolutions that each of the quasi-sinusoidal signals goes through during one rotation of the motor shaft may be selected based, for example, on a desired resolution of the analog encoding apparatus. A suitable predetermined number may be 1200 complete revolutions during one rotation of the motor shaft.

During the calibration operation, the ADC_DAC calibration unit 210 inputs sequentially increasing input values to the D/A converter 220 beginning with a minimum input value of 0 and increasing the input value by 1 each time until a maximum input value of the D/A converter is reached. However, the invention is not limited to this pattern of sequentially increasing input values, but can use any suitable pattern of changing the input values until all possible input values have been used. For example, the ADC_DAC calibration unit 210 can input sequentially decreasing input values to the D/A converter 220 beginning with a maximum input value and decreasing the input value by 1 each time until a minimum input value of 0 is reached. Or, for example, the ADC_DAC calibration unit 210 can input sequentially increasing even input values beginning with a minimum even input value of 0 and increasing the even input value by 2 each time until a maximum even input value is reached, and then input sequentially decreasing odd input values beginning with a maximum odd input value and decreasing the odd input value by 2 each time until a minimum odd input value of 1 is reached.

The ADC_DAC calibration unit 210 then generates the calibration table that calibrates the input of the D/A converter 220 based on output values of the A/D converter 250 produced in response to the sequentially increasing input values input to the D/A converter 220 as described in detail below. During a normal operation of the analog encoding apparatus after the calibration operation has been completed, the ADC_DAC calibration unit 210 inputs to the D/A converter 220 two input values obtained from the calibration table in response to two analog encoder pattern values output from the analog encoder patter storage unit 260.

The D/A converter 220 converts the two digital input values from the ADC_DAC calibration unit 210 into two analog output values. The comparison unit 230 compares the two signals output from the analog encoder 200 with respective ones of the two analog output values from the D/A converter 220, and outputs state change information constituted by two digital signals of "1" or "0" in accordance with results of the comparison. More particularly, the comparison unit 230 includes a first comparator 232 that compares a first output aX of the analog encoder 200 with a first output DacX of the D/A converter 220 and outputs a value Xup in accordance with a result of the comparison, and a second comparator 234 that compares a second output aY of the analog encoder 200 with a second output DacY of the D/A converter 220 and outputs a value Yup in accordance with a result of the comparison.

The MUX 240 selectively outputs either the outputs aX and aY of the analog encoder 200 or the outputs DacX and DacY of the D/A converter 220. The MUX 240 includes a first analog MUX 242 and a second analog MUX 244. The first analog MUX 242 receives as inputs the first output aX of the analog encoder 200 and the first output DacX of the D/A converter 220. The second analog MUX 244 receives as inputs the second output aY of the analog encoder 200 and the second output DacY of the D/A converter 220.

During the calibration operation, the first analog MUX 242 outputs the first output DacX of the D/A converter 220, and the second analog MUX 244 outputs the second output DacY of the D/A converter 220. During an initialization operation of the analog encoding apparatus, the first analog MUX 242 outputs the first output aX of the analog encoder 200, and the second analog MUX 244 outputs the second output aY of the analog encoder 200 for use in generating an analog encoder pattern that is stored in the analog encoder pattern storage unit 260 as described in detail below.

During the calibration operation, the A/D converter 250 digitizes the outputs DacX and DacY of the D/A converter 220 that are respectively output from the first analog MUX 242 and the second analog MUX 244 of the MUX 240. During the initialization operation, the A/D converter 250 digitizes the outputs aX and aY of the analog encoder 200 that are respectively output from the first analog MUX 242 and the second analog MUX 244 of the MUX 240. For the sake of simplicity, FIG. 2 shows that the A/D converter 250 has one output connected to one input of the analog encoder pattern storage unit 260. If this is case, the A/D converter may alternately output values obtained by digitizing the output of the first analog MUX 242 and values obtained by digitizing the output of the second analog MUX 244. Alternatively, the A/D converter 250 may have two outputs connected to two inputs of the analog encoder pattern storage unit 260. One of the two outputs may output digitized values obtained by digitizing the output of the first analog MUX 242, and the other one of the two outputs may output digitized values obtained by digitizing the output of the second analog MUX 244.

The analog encoder pattern storage unit 260 stores an analog encoder pattern that is generated by digitizing the two output signals of the analog encoder 200 at a plurality of sampling points in one complete period of the two output signals. The sampling points correspond to states of the two output signals of the analog encoder 200. For example, FIGS. 4 and 5 described below show waveforms based on 16 sampling points in one complete period of the two output signals of the analog encoder 200. These 16 sampling points may be considered to correspond to 16 states numbered 0 to 15, or 000 to 111 in binary notation. The analog encoder pattern storage unit 260 may store the digitized values of the two output signals of the analog encoder 200 as analog encoder pattern values indexed by state values of 000 to 111. Thus, for example, the digitized values of the two output signals of the analog encoder 200 sampled at the first sampling point corresponding to the state 0 may be stored as two analog encoder pattern values indexed by a state value of 000. However, the invention is not limited to this method of indexing the stored analog encoder pattern values, and any suitable method of indexing can be used. Also, the invention is not limited to the use of 16 sampling points, and any suitable number of sampling points can be used. The greater the number of sampling points, the more accurately the position of the motor can be determined and the more accurately the rotation of the motor can be controlled.

The analog encoder pattern storage unit 260 also stores a matching table that matches in a one-to-one relationship input values of the D/A converter 220 to output values of the A/D converter 250 produced by inputting those input values to the D/A converter 220 in the calibration operation described above and in greater detail below. The matching table is described in greater detail below.

The analog encoder pattern storage unit 260 outputs two analog encoder pattern values corresponding to a present estimated state in response to a present estimated state input to the analog encoder pattern storage unit 260 from the present estimated state latch unit 270. Thus, for example, if the present estimated state input from the present estimated state latch unit 270 is the state 0, the analog encoder pattern storage unit 260 outputs the two analog encoder pattern values that are indexed by the state value of 000.

The present estimated state latch unit 270 receives as an input a next estimated state SS[0:n] from the next estimated state determination unit 275, latches the next estimated state SS[0:n] in synchronism with a reference clock to produce a present estimated state S[0:n], and inputs the present estimated state S[0:n] to the analog encoder pattern storage unit 260, the next estimated state determination unit 275, and the Gray code converter 280. The next estimated state determination unit 275 determines the next estimated state SS[0:n] based on the state change information Xup and Yup input from the comparison unit 230 and the present estimated state S[0:n] input from the present estimated state latch unit 270.

The Gray code converter 280 converts the present estimated state S[0:n] input from the present estimated state latch unit 270 into Gray-coded digital encoding signals dX and dY.

The control unit 290 is connected to the ADC_DAC calibration unit 210 and the analog encoder pattern storage unit 260. The control unit 290 controls the ADC_DAC calibration unit 210 to perform the calibration operation. The calibration operation is performed to compensate for a functional difference between the D/A converter 220 and the A/D converter 250. The calibration operation may be performed whenever power is supplied to the analog encoding apparatus, and/or may be performed whenever desired by a user of the analog encoding apparatus. As described in greater detail below, during the calibration operation, the control unit 290 generates a matching table that is stored in the analog encoder pattern storage unit 260, and controls the ADC_DAC calibration unit 210 to generate a calibration table based on the matching table.

During the normal operation of the analog encoding apparatus, the control unit 290 controls the analog encoder pattern storage unit 260 so that the analog encoder pattern storage unit 260 outputs analog encoder pattern values corresponding to the present state input S[0:n] from the present estimated state latch unit 270.

Figure 3:
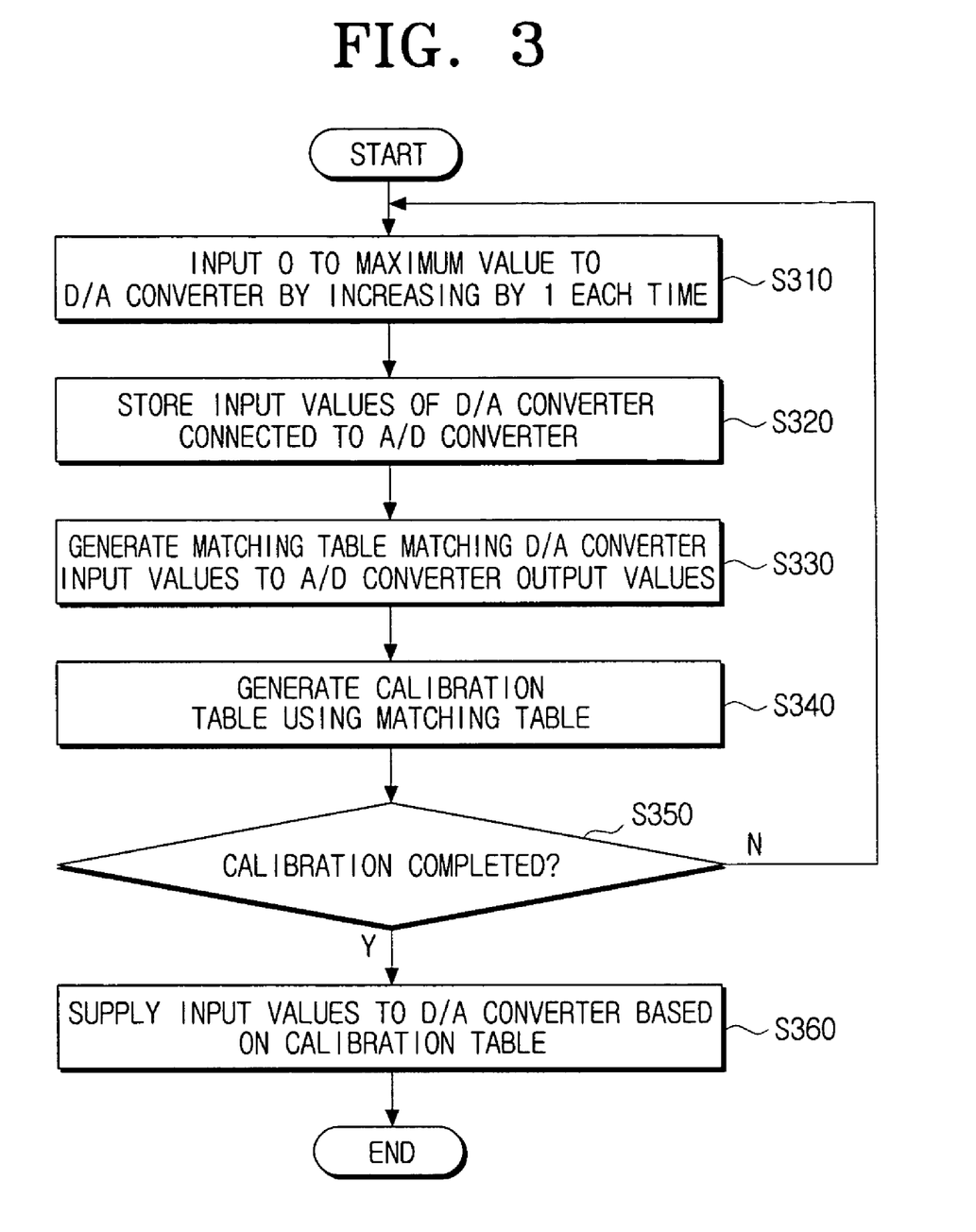
FIG. 3 is a flowchart for explaining a method of calibrating an input of a digital/analog (D/A) converter based on an output of an analog/digital (A/D) converter in the analog encoding apparatus in FIG. 2 according to an embodiment of the invention.

FIG. 3 is a flowchart for explaining a method of calibrating an input of the D/A converter 220 based on an output of the A/D converter 250 in the analog encoding apparatus in FIG. 2 according to an embodiment of the invention.

Referring to FIG. 3, during the calibration operation, the two outputs of the D/A converter 220 are connected to the two inputs of the A/D converter 250 by the MUX 240, and the control unit 290 controls the ADC_DAC calibration unit 210 to input sequentially increasing input values to the D/A converter 220 and to the analog encoder pattern storage unit 260 beginning with an input value of 0 and increasing the input value by 1 each time until a maximum input value of the D/A converter 220 is reached (block S310). For example, if the D/A converter 220 is an 8-bit D/A converter, the ADC_DAC calibration unit 210 inputs sequentially increasing input values of $2^0-1 \sim 2^8-1$ to the D/A converter 220 beginning with an input value of $2^0-1=0$ and increasing the input value by 1 each time until a maximum input value of $2^8-1=255$ is reached (that is, 0, 1, 2, 3, . . . 255), for a total of 256 input values.

The control unit 290 controls the analog encoder pattern storage unit 260 to store the input values of the D/A converter 220 that were input to the D/A converter 220 and the analog encoder pattern storage unit 260 from the ADC_DAC calibration unit 210 (block S320). Alternatively, the ADC_DAC calibration unit 210 may input the input values of the D/A converter 220 to only the D/A converter 220, and the control unit 290 may read out the input values of the D/A converter 220 from the ADC_DAC calibration unit 210 and store the input values in the analog encoder pattern storage unit 260.

The control unit 290 generates a matching table that matches input values of the D/A converter 220 that were input to the D/A converter 220 from the ADC_DAC calibration unit 210 to corresponding output values of the A/D converter 250 that were produced in response to those input values (block S330). The control unit 290 generates the matching table by controlling the analog encoder pattern storage unit 260 to store output values of the A/D converter 250 in association with corresponding ones of the input values of the D/A converter 220 that were stored in the analog encoder pattern storage unit 260 under the control of the control unit 290. The following Table 1 is an example of a matching table that matches the input values (DAC_in) of the D/A converter 220 to corresponding ones of the output values (ADC_out of the A/D converter 250 generated when using an 8-bit D/A converter as the D/A converter 220. However, the invention is not limited to the use of an 8-bit D/A converter or to the use of any particular configuration for Table 1, and a D/A converter having any suitable number of bits can be used as the D/A converter 220 and any suitable configuration can be used for Table 1.

TABLE 1

| DAC_in  | 0 | 1 | 2 | 3 | 4 | ... | 19 | 20 | ... |
|---------|---|---|---|---|---|-----|----|----|-----|
| ADC_out | 0 | 0 | 0 | 1 | 2 | ... | 17 | 18 | ... |

Referring to Table 1, when the ADC_DAC calibration unit 210 inputs "4" to the D/A converter 220, the A/D converter 250 outputs "2". When the ADC_DAC calibration unit 210 inputs "20" to the D/A converter 220, the A/D converter 250 outputs "18".

The control unit 290 controls the ADC_DAC calibration unit 210 to generate the calibration table based on the matching table (block S340). The following Table 2 is an example of a calibration table generated based on the matching table of Table 1. However, the invention is not limited to the use of any particular configuration for Table 2, and any suitable configuration can be used. The calibration table can be generated by generating as the calibration table a copy of the matching table with the output values (ADC_out) stored in the matching table being arranged as input values (ADC_out) of the calibration table, and the input values (DAC_in) stored in the matching table being arranged as output values (DAC_in) of the calibration table, while maintaining the matching between the input values (DAC_in) and the output values (ADC_out) as stored in the matching table. For example, the output value (ADC_out) of 17 stored in the matching table is arranged as an input value (ADC_out) of 17 of the calibration table, and the input value (DAC_in) of 19 stored in the matching table is arranged as an output value (DAC_in) of 19 of the calibration table, while maintaining the matching between the input value (DAC_in) of 19 and the output value (ADC_out) of 17 as stored in the matching table. However, the invention is not limited to this method of generating the calibration table, and any suitable method can be used.

TABLE 2

| ADC_out | 0 | 0 | 0 | 1 | 2 | ... | 17 | 18 | ... |
| --- | --- | --- | --- | --- | --- | --- | --- | --- | --- |
| DAC_in | 0 | 1 | 2 | 3 | 4 | ... | 19 | 20 | ... |

According to Table 2, in order for the A/D converter 250 to output "2", the ADC_DAC calibration unit 210 must input "4" to the D/A converter 220. In order for the A/D converter 250 to output "18", the ADC_DAC calibration unit 210 must input "20" to the D/A converter 220.

The control unit 290 determines whether the calibration operation has been completed, that is, whether the input value of the D/A converter 220 has been increased up to the maximum input value of the D/A converter 220 (block S350). If it is determined that the calibration operation has not been completed (block S350-N), (block S310) to (block S350) are repeated.

If it is determined that the calibration operation has been completed (block S350-Y), the ADC_DAC calibration unit 210 supplies input values to the D/A converter 220 based on the calibration table (block S360) during the initialization and normal operations of the analog encoding apparatus.

During the initialization operation, the A/D converter 250 digitizes the output of the analog encoder 200 at a plurality of sampling points to obtain analog encoder pattern values that are stored in the analog encoder pattern storage unit 260. Assuming that the output of the analog encoder 200 is "2", the A/D converter 250 will output an analog encoder pattern value of "2" that is stored in the analog encoder pattern storage unit 260. If the analog encoder pattern value of "2" is output from the analog encoder pattern storage unit 260 during the normal operation of the analog encoding apparatus and input directly to the D/A converter 220 as is done in the analog encoding apparatus of the related art shown in FIG. 1, the D/A converter 220 will output a pattern value of "0" as can be seen from Table 1, rather than the intended pattern value of "2", due to the functional difference between the D/A converter 220 and the A/D converter 250. As a result, the comparison between the output of the analog encoder 200 and the pattern value output from the D/A converter 220 performed by the comparison unit 230 is incorrect because the pattern value is "0" rather than the intended pattern value of "2", and accordingly accuracy of the digital encoding signals dX and dY is decreased.

According to the invention, however, the analog encoder pattern value of "2" output from the analog encoder pattern storage unit 260 is input to the ADC_DAC calibration unit 210 which inputs an input value of "4" to the D/A converter 220 in accordance with the calibration table shown in Table 2 which shows that an ADC_out of "2" requires a DAC_in of "4". The input value of "4" causes the D/A converter 220 to output a correct pattern value of "2". As a result, the comparison between the output of the analog encoder 200 and the pattern value output from the D/A converter 220 performed by the comparison unit 230 is correct because the pattern value is the intended pattern value of "2", and accordingly accuracy of the digital encoding signals dX and dY is not decreased.

Figure 4:
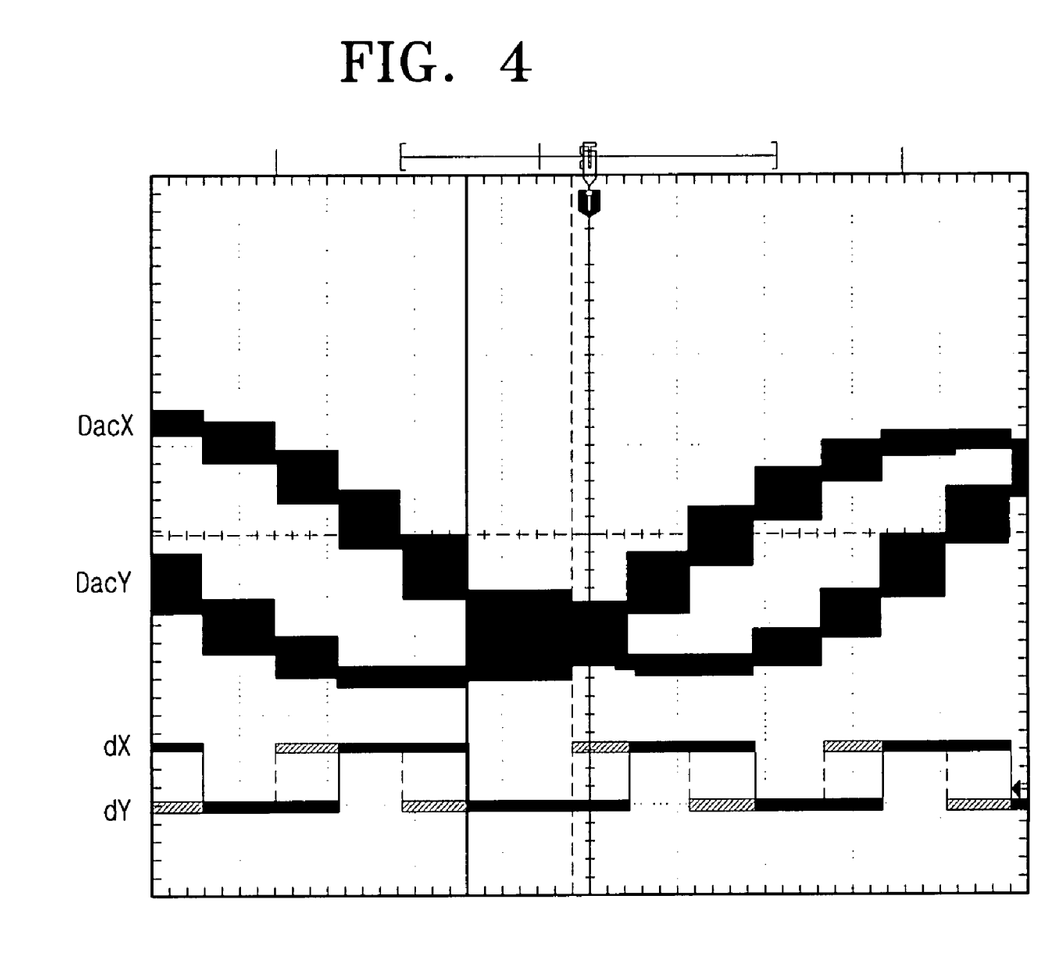
FIG. 4 shows digital encoding waveforms before calibrating the input of the D/A converter based on the output of the A/D converter according to an embodiment of the invention.

FIG. 4 shows digital encoding waveforms before calibrating the input of the D/A converter 220 based on the output of the A/D converter 250 according to an embodiment of the invention.

More particularly, FIG. 4 shows D/A converter output waveforms DacX and DacY output from the D/A converter 220 corresponding to analog encoder pattern values output from the analog encoder pattern storage unit 260 and digital encoding waveforms dX and dY generated by the Gray code converter 280 before performing the calibration operation. One period of the D/A converter output waveforms DacX and DacY is divided into 16 divisions. The digital encoding waveforms dX and dY are divided into divisions each corresponding to 2 divisions of the D/A converter output waveforms DacX and DacY. Thus, there are 8 divisions of the digital encoding waveforms dX and dY in one period of the D/A converter output waveforms DacX and DacY. In the lower portion of FIG. 4, the solid black bars represent the digital encoding waveform dX, and the hashed bars indicate the digital encoding waveform dY. Half of each of the hashed bars overlaps with half of one of the solid black bars. The thin solid vertical lines represent transitions between states of the digital encoding waveform dX, and the thin dashed vertical lines indicate transitions between states of the digital encoding waveform dY. Accuracy of the generated digital encoding waveforms dX and dY can be calculated from the following Equation 1:

$$\text{accuracy} = \frac{(\alpha - a)}{a} * 100 \qquad \text{Equation 1}$$

In Equation 1, "α" denotes the longest waveform between the D/A converter output waveforms DacX and DacY of one channel, and "a" denotes a length of target D/A converter output waveforms DacX and DacY. Here, "a" may be set to an arbitrary value.

In this example, "a" is assumed to be 74. In FIG. 4, "α", which is the length from the solid vertical line to dashed vertical line in FIG. 4, is 114, and the accuracy of the digital encoding waveforms dX and dY before the calibration operation calculated using Equation 1 is (114−74)/74*100=54%.

Figure 5:
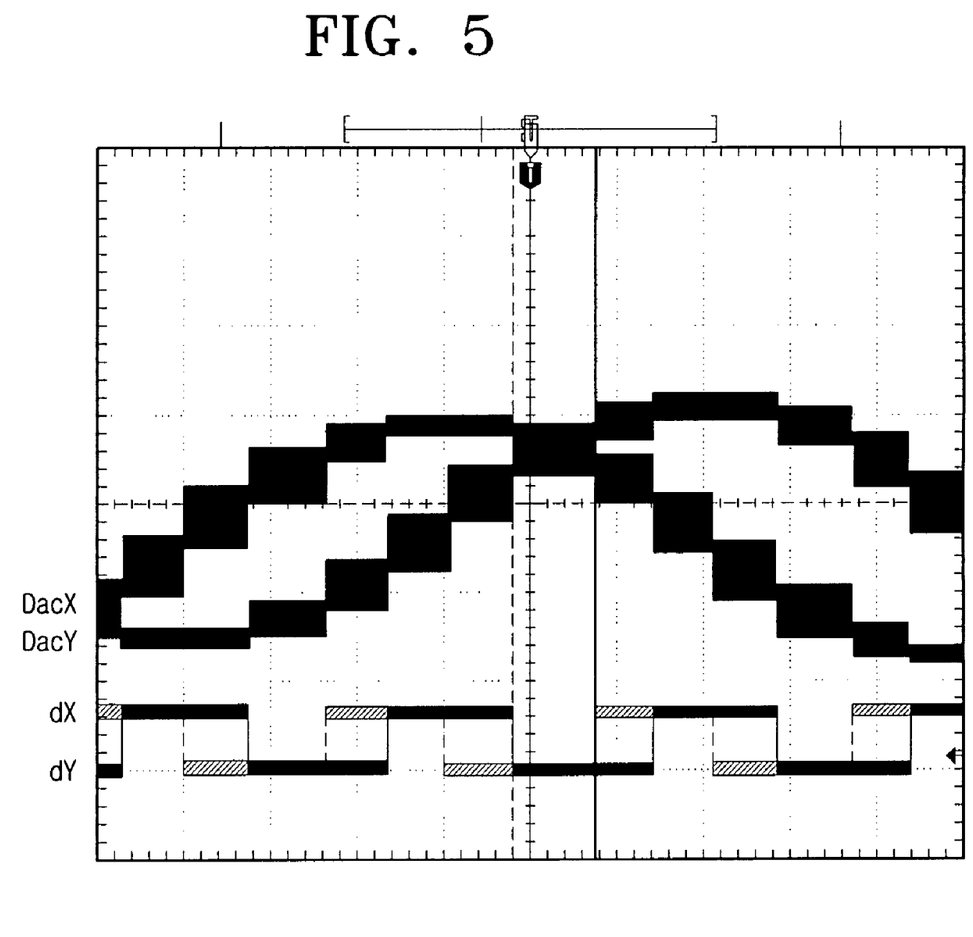
FIG. 5 shows digital encoding waveforms after calibrating the input of the D/A converter based on the output of the A/D converter according to an embodiment of the invention

FIG. 5 shows digital encoding waveforms after calibrating the input of the D/A converter 220 based on the output of the A/D converter 250 according to an embodiment of the invention.

More particularly, FIG. 5, shows D/A converter output waveforms DacX and DacY output from the D/A converter 220 corresponding to analog encoder pattern values output from the analog encoder pattern storage unit 260 and digital encoding waveforms dX and dY generated by the Gray code converter 280 after performing the calibration operation. Here, "a" is 74 as in the above example of FIG. 4, and "α", which is the length from the dashed vertical line to the solid vertical line in FIG. 5, is 92. Therefore, according to Equation 1, the accuracy of the digital encoding waveforms dX and dY after the calibration operation is (92−74)/74*100=24%.

By calibrating the input of the D/A converter 220 based on the output of the A/D converter 250 according to an embodiment of the invention, the accuracy of the digital encoding waveforms dX and dY of the analog encoding apparatus shown in FIG. 2 according to an embodiment of the invention can be improved by approximately 30% in comparison with the digital encoding waveforms of the analog encoding apparatus of the related art shown in FIG. 1.

As can be appreciated from the above description of the embodiment of the invention shown in FIG. 2, since the input of the D/A converter 220 is calibrated to compensate for the functional difference between the D/A converter 220 and the A/D converter 250, the comparator 240 can compare the output of the analog encoder 200 with the correct pattern values, thereby improving the accuracy of the digital encoding signals dX and dY.

Although several embodiments of the invention have been shown and described, it would be appreciated by those skilled in the art that changes may be made in these embodiments of the invention without departing from the principles and spirit of the invention, the scope of which is defined in the claims and their equivalents.

What is claimed is:

1. A method of calibrating an input of a digital-to-analog (D/A) converter based on an output of an analog-to-digital (A/D) converter in an analog encoding apparatus comprising the D/A converter and the A/D converter, the method comprising:

connecting an output of the D/A converter to an input of the A/D converter;

inputting a certain range of sequentially increasing input values to the D/A converter while the output of the D/A converter is connected to the input of the A/D converter, thereby producing corresponding output values from the A/D converter;

generating a calibration table representing a relationship between input values of the D/A converter and output values of the A/D converter based on the input values in the certain range of sequentially increasing input values inputted to the D/A converter and the corresponding output values produced from the A/D converter;

disconnecting the output of the D/A converter from the input of the A/D converter; and adjusting an input value of the D/A converter based on the calibration table while the output of the D/A converter is disconnected from the input of the A/D converter.

2. The method of claim 1, wherein the input value of the D/A converter to be adjusted is an output value of the A/D converter corresponding to a present state; and wherein the adjusting comprises obtaining from the calibration table an input value corresponding to the output value of the A/D converter corresponding to the present state and inputting the obtained input value to the D/A converter in place of the input value of the D/A converter to be adjusted.

3. The method of claim 1, further comprising generating a matching table that matches the input values in the certain range of sequentially increasing input values inputted to the D/A converter to the corresponding output values produced from the A/D converter.

4. The method of claim 3, wherein the generating of the calibration table comprises generating the calibration table based on the matching table.

5. An analog encoding apparatus comprising:
a digital-to-analog (D/A) converter;
an analog-to-digital (A/D) converter;
a multiplexer (MUX) that selectively connects and disconnects an output of the D/A converter to an input of the A/D converter; and
a calibration unit that
inputs a certain range of sequentially increasing input values to the D/A converter while the output of the D/A converter is connected to the input of the A/D converter by the MUX, thereby producing corresponding output values from the A/D converter,
generates a calibration table representing a relationship between input values of the D/A converter and output values of the A/D converter based on the input values in the certain range of sequentially increasing input values inputted to the D/A converter and the corresponding output values produced from the A/D converter, and
adjusts an input value of the D/A converter based on the calibration table while the output of the D/A converter is disconnected from the input of the A/D converter by the MUX.

6. The apparatus of claim 5, wherein the input value of the D/A converter to be adjusted is an output value of the A/D converter corresponding to a present state; and wherein the calibration unit obtains from the calibration table an input value corresponding to the output value of the A/D converter corresponding to the present state and inputs the obtained input value to the D/A converter in place of the input value of the D/A converter to be adjusted.

7. The apparatus of claim 5, further comprising a control unit that generates a matching table that matches the input values in the certain range of sequentially increasing input values inputted to the D/A converter to the corresponding output values produced from the A/D converter.

8. The apparatus of claim 7, wherein the calibration unit generates the calibration table based on the matching table.

9. A method of compensating for a functional difference between a digital-to-analog (D/A) converter and an analog-to-digital (A/D) converter in an analog encoding apparatus that generates a digital encoding signal based on a comparison between a current value of an output signal of an analog encoder and an analog value generated by the D/A converter based on a selected one of a plurality of digital values previously generated by the A/D converter by sampling a value of the output signal of the analog encoder at a plurality of sampling points, the functional difference between the D/A converter and the A/D converter causing analog values generated by the D/A converter based on at least some of the plurality of digital values to be not equal to respective values of the analog encoder signal as sampled by the A/D converter in generating the at least some of the plurality of digital values, the method comprising:

detecting the functional difference between the D/A converter and the A/D converter; and adjusting an input value to be inputted to the D/A converter to compensate for the detected functional difference.

10. The method of claim 9, wherein the detecting of the functional difference comprises:

connecting an output of the D/A converter to an input of the A/D converter;

inputting a plurality of input values to the D/A converter while the output of the D/A converter is connected to the input of the A/D converter;

storing the plurality of input values in a matching table; and storing a plurality of output values of the A/D converter produced by the plurality of input values while the output of the D/A converter is connected to the input of the A/D converter in the matching table in a one-to-one correspondence with the plurality of input values stored in the matching table so that each one of the plurality of output values is matched with a respective one of the plurality of input values that produced the one of the plurality of output values, wherein differences between matched ones of the input values and the output values represent the functional difference between the D/A converter and the A/D converter.

11. The method of claim 10, wherein the inputting of a plurality of input values comprises inputting all possible input values of the D/A converter while the output of the D/A converter is connected to the input of the A/D converter.

12. The method of claim 11, wherein the inputting of all possible input values comprises sequentially inputting all of the possible input values to the D/A converter starting at an initial input value of 0 and repeatedly increasing an input value by 1 until a maximum input value of the D/A converter is reached.

13. The method of claim 10, wherein the adjusting of an input value comprises:

generating a calibration table based on the matching table, the calibration table having stored therein a plurality of input values matched in a one-to-one correspondence with a plurality of output values so that each one of the plurality of input values is matched with a respective one of the plurality of output values that will produce the one of the plurality of input values at an output of the A/D converter when the one of the plurality of output values is inputted to the D/A converter while the output of the D/A converter is connected to the input of the A/D converter;

disconnecting the output of the D/A converter from the A/D converter;

selecting one of the plurality of digital values previously generated by the A/D converter as an input value to be inputted to the D/A converter;

finding an input value in the calibration table that is equal to the input value to be inputted to the D/A converter;

outputting the output value in the calibration table that is matched with the found input value; and inputting the output value outputted from the calibration table to the D/A converter as an adjusted input value in place of the input value to be inputted to the D/A converter to compensate for the detected functional difference while the output of the D/A converter is disconnected from the input of the A/D converter.

14. The method of claim 13, wherein the generating of a calibration table comprises generating as the calibration table a copy of the matching table with the output values stored in the matching table being arranged as input values of the calibration table, and the input values stored in the matching table being arranged as output values of the calibration table, while maintaining the matching between the input values and the output values as stored in the matching table.

15. The method of claim 13, wherein the plurality of digital values previously generated by the D/A converter are stored in an analog encoder pattern storage unit in which the plurality of digital values are respectively indexed by a plurality of states of the output signal of the analog encoder respectively corresponding to the plurality of sampling points;

wherein the analog encoding apparatus generates a present estimated state of the output signal of the analog encoder; and wherein the selecting of one of the plurality of digital values comprises:

finding a digital value in the analog encoder pattern storage unit that is indexed by a state of the output signal of the analog encoder that is equal to the present estimated state of the output signal of the analog encoder; and outputting the found digital value as the input value to be inputted to the D/A converter.

16. The method of claim 15, further comprising:

comparing the current value of the output signal of the analog encoder with an analog value generated by the D/A converter from the input value outputted from the calibration table;

generating state change information based on a result of the comparing;

generating a next estimated state of the output signal of the analog encoder based on the state change information and the present estimated state of the output signal of the analog encoder;

latching the next estimated state of the output signal of the analog encoder as a new present estimated state of the output signal of the analog encoder; and generating the digital encoding signal based on the new present estimated state of the output signal of the analog encoder.

17. The method of claim 16, wherein the digital encoding signal is a Gray-coded digital encoding signal.

* * * * *